US010012446B2

(12) United States Patent
Chin

(10) Patent No.: US 10,012,446 B2
(45) Date of Patent: Jul. 3, 2018

(54) VAPOR CHAMBER

(71) Applicant: ACMECOOLS TECH. LTD., Road Town, Tortola (VG)

(72) Inventor: Chi-Te Chin, Taichung (TW)

(73) Assignee: ACMECOOLS TECH. LTD., Tortola (VG)

( * ) Notice: Subject to any disclaimer, the term of this patent is extended or adjusted under 35 U.S.C. 154(b) by 99 days.

(21) Appl. No.: 14/847,785

(22) Filed: Sep. 8, 2015

(65) Prior Publication Data

US 2017/0067696 A1 Mar. 9, 2017

(51) Int. Cl.
| *F28F 9/007* | (2006.01) |
| *F28D 15/04* | (2006.01) |
| *F28F 3/02* | (2006.01) |
| *F28D 15/02* | (2006.01) |
| *H01L 23/427* | (2006.01) |

(52) U.S. Cl.
CPC ....... *F28D 15/046* (2013.01); *F28D 15/0233* (2013.01); *F28F 3/02* (2013.01); *H01L 23/427* (2013.01); *F28D 15/04* (2013.01); *F28D 15/043* (2013.01); *F28F 9/007* (2013.01); *F28F 9/0075* (2013.01)

(58) Field of Classification Search
CPC ....... F28F 9/007; F28F 9/0075; F28D 15/046; F28D 15/04; F28D 15/043
USPC ....................................... 165/104.26, 104.33
See application file for complete search history.

(56) References Cited

U.S. PATENT DOCUMENTS

| 8,074,706 B2 * | 12/2011 | Su .......................... F28D 15/046 165/104.26 |
| 2003/0159806 A1 * | 8/2003 | Sehmbey ............ F28D 15/0233 165/80.3 |
| 2005/0098303 A1 * | 5/2005 | Lindemuth ............. B22F 7/004 165/104.26 |
| 2009/0236085 A1 * | 9/2009 | Wang .................... F28D 15/046 165/169 |
| 2011/0120674 A1 * | 5/2011 | MacDonald .......... F28D 15/046 165/104.26 |
| 2012/0048518 A1 * | 3/2012 | Zhou .................... F28D 15/0233 165/104.26 |
| 2014/0014304 A1 | 1/2014 | Chin |

FOREIGN PATENT DOCUMENTS

TW          201331538          8/2013

* cited by examiner

*Primary Examiner* — Jianying Atkisson
*Assistant Examiner* — Joel Attey
(74) *Attorney, Agent, or Firm* — Muncy, Geissler, Olds & Lowe, P.C.

(57) ABSTRACT

A vapor chamber includes an upper casing, a lower casing, a support member, a wick material and a working fluid. The support member is formed of a plurality of ribs connected with each other, and a plurality of surrounded spaces are formed and regularly arranged between the ribs. Each rib has an upper abutting end and a lower abutting end. By the interconnection of the upper abutting ends and the lower abutting ends of the ribs, the ribs are inclined and each has a relatively higher end and a relatively lower end, so that a plurality of subspaces are respectively formed under the body of each rib close to the upper abutting end and above the body of each rib close to the lower abutting end, and the subspaces are in communication with the surrounded spaces between the ribs.

8 Claims, 6 Drawing Sheets

VAPOR CHAMBER

BACKGROUND OF THE INVENTION

1. Technical Field

The present disclosure relates to a heat dissipation technology, more particularly to a vapor chamber having a wick material and a vacuum chamber for phase change between liquid and vapor of a working fluid, to perform a temperature uniformity effect.

2. Description of Related Art

Taiwan Publication No. 201331538 (corresponding U.S. Patent Publication No. 2014/0014304A1) is disclosed by the applicant of the present disclosure and reveals a vapor chamber without an injection tube which can provide satisfactory reliability and heat dissipation performance.

As shown in FIG. 9 of the above-mentioned prior art, the support member has a plurality of bent plates for support which are formed by stamping a net frame upwardly and downwardly. However, the support strength of the bent plates is insufficient in practical use. Specifically, during the operation of a vapor chamber, a heat source is usually attached to a surface of the vapor chamber and a heat sink is attached to the opposite surface of the vapor chamber. Because a clamp (not shown in FIG. 9) is often used to force the heat sink to attach to the vapor chamber tightly, two surfaces of the vapor chamber are pressurized to deform the vapor chamber. Accordingly, if the support strength of the support member is insufficient, the vapor chamber may not have enough space for the working fluid to evaporate from a liquid phase to a vapor phase due to the deformation of the vapor chamber. As a result, the vapor chamber may have degraded temperature uniformity and thermal conduction. Because the support member of the prior vapor chamber includes the bent plates which may be further bent under an external pressure, the prior vapor chamber may have insufficient support strength.

SUMMARY OF THE INVENTION

The main objective of the present disclosure is to provide a vapor chamber which has a support member with sufficient support strength, so that the vapor chamber can be prevented from being deformed by a normal external force such as clamping force, and the temperature uniformity and thermal conduction thereof can be maintained during normal operation.

A vapor chamber according to the present disclosure includes an upper casing, a lower casing connected to the upper casing to form a receiving space, a support member disposed in the receiving space and formed of a plurality of ribs connected with each other, a wick material disposed in the receiving space, and a working fluid injected into the receiving space and absorbed by the wick material. A plurality of surrounded spaces are formed and regularly arranged between the ribs. Two ends of each rib are respectively defined as an upper abutting end and a lower abutting end, the upper abutting end of one rib is located on the lower abutting ends of two other ribs, and the lower abutting end of one rib is located under and connected to the upper abutting ends of two other ribs. The wick material is band-shaped, is arranged annularly around the top, bottom and both sides of the support member, and has an upper part corresponding to the top of the support member and a lower part corresponding to the bottom of the support member. The upper part of the wick material is connected to a bottom surface of the upper casing by sintering, and the lower part of the wick material is connected to a top surface of the lower casing by sintering. The wick material is stopped against the bottom surface of the upper casing and the top surface of the lower casing by support of the upper abutting ends and the lower abutting ends of the ribs of the support member. By means of the interconnection of the upper abutting ends and the lower abutting ends of the ribs, the ribs are inclined and each has a relatively higher end and a relatively lower end, so that a plurality of subspaces are respectively formed under a body of each rib close to the upper abutting end and above the body of each rib close to the lower abutting end. The subspaces are in communication with the surrounded spaces between the ribs.

As such, the support member can have a plurality of support bodies, each of which is formed by one of the upper abutting ends and two lower abutting ends under and connected to the upper abutting end. Therefore, the support member can provide sufficient support strength to ensure that the vapor chamber of the present disclosure can be prevented from being deformed by the normal external force. As a result, the temperature uniformity and thermal conduction of the vapor chamber can be maintained during normal operation.

DETAILED DESCRIPTION OF EMBODIMENTS

Figure 1:
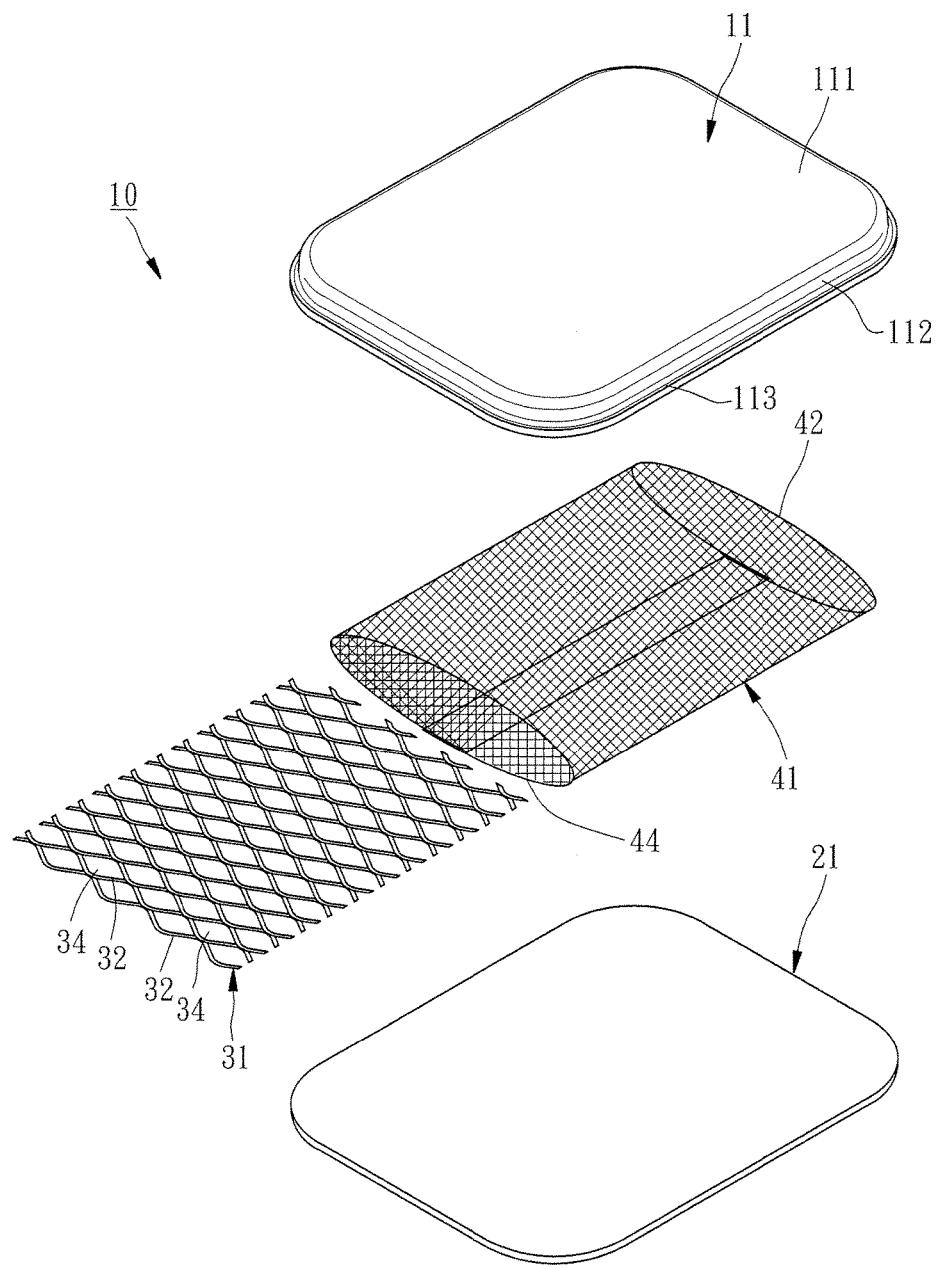
FIG. 1 is an exploded view of a first preferred embodiment of the present disclosure.
Figure 2:
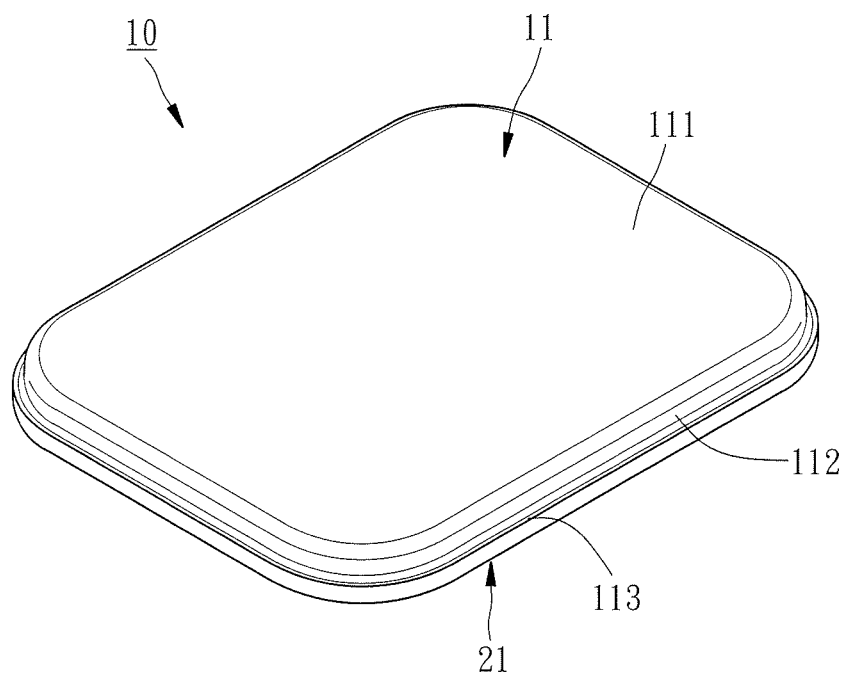
FIG. 2 is an assembly perspective view of the first preferred embodiment of the present disclosure.

The present disclosure will become more fully understood from the detailed description and the accompanying drawings, wherein:

Referring to FIG. 1 through FIG. 5, a vapor chamber 10 according to a preferred embodiment of the present disclosure includes an upper casing 11, a lower casing 21, a support member 31, a wick material 41 and a working fluid.

The upper casing 11 and the lower casing 21 are connected together edge-to-edge to form a receiving space 12 therebetween. In this embodiment, the lower casing 21 is a plate-shaped. The upper casing 11 has a body 111, a side wall 112 extending downwardly from an edge of the body 111, and a shoulder part 113 extending horizontally outwardly from the side wall 112. The upper casing 11 is first attached to a top surface of the lower casing 21 through the shoulder part 113 thereof, and then the shoulder part 113 and the top surface of the lower casing 21 are bonded together by a welding process to form a structure having no weld joint. The aforesaid welding process is a high-energy welding such as electron-beam welding, high-frequency arc welding and laser-beam welding.

Figure 4:
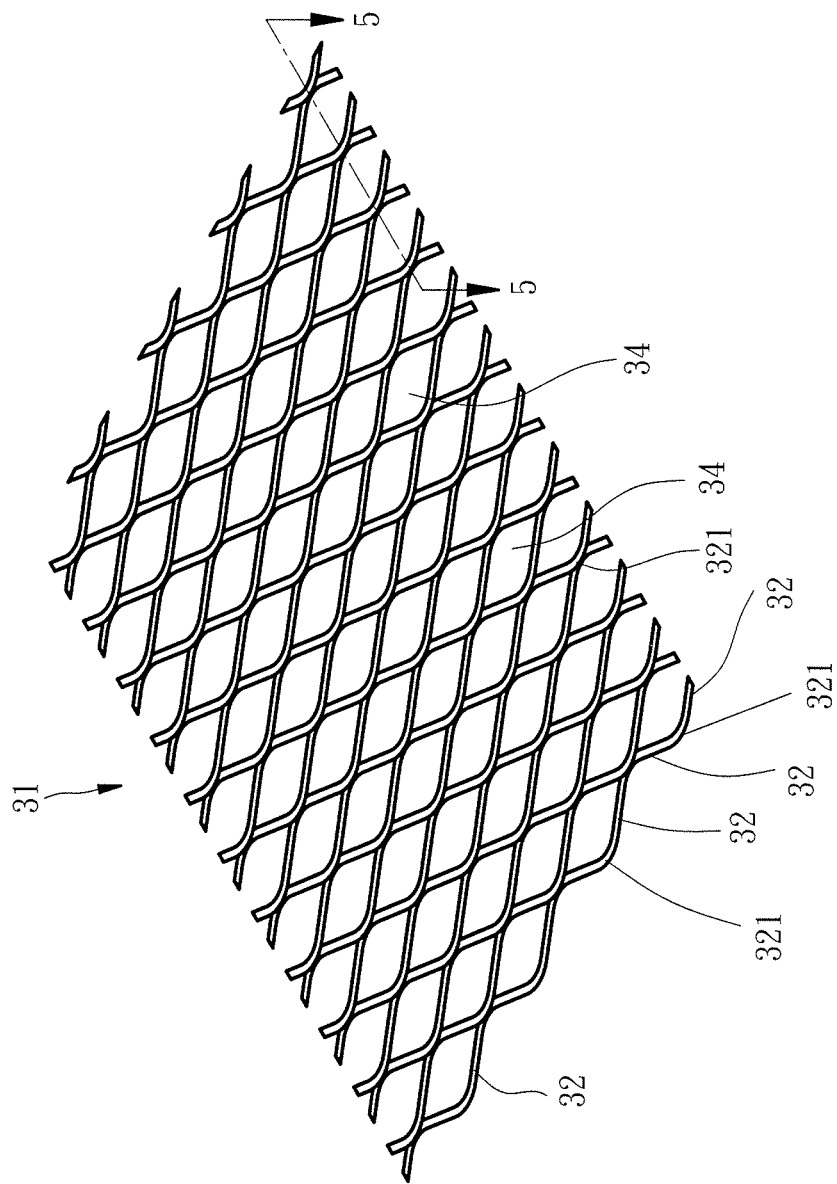
FIG. 4 is a perspective view of a support member of the first preferred embodiment of the present disclosure.

The support member 31 is placed in the receiving space 12. The support member 31 is formed of a plurality of ribs 32 connected with each other. A plurality of surrounded spaces 34 are formed and regularly arranged between the ribs 32. Two ends of each rib 32 are respectively defined as an upper abutting end 321 and a lower abutting end 322. For each rib 32, the upper abutting end 321 thereof is located on the lower abutting ends 322 of two other ribs 32, and the lower abutting end 322 thereof is located under and connected to the upper abutting ends 321 of two other ribs 32. In this embodiment, the ribs 32 are formed integrally. In addition, two lower abutting ends 322 of two ribs 32 located under the upper abutting end 321 of one rib 32 are connected with each other, and two upper abutting ends 321 of two ribs 32 located on the lower abutting end 322 of one rib 32 are connected with each other. As shown in FIG. 4, each surrounded space 34 is surrounded by four ribs 32 and substantially has a quadrilateral or diamond shape.

The wick material 41 is disposed in the receiving space 12. The wick material 41 is band-shaped and arranged annularly around the top, bottom, and both sides of the support member 31, and has an upper part 42 corresponding to the top of the support member 31 and a lower part 44 corresponding to the bottom of the support member 31. The upper part 42 is connected to the bottom surface of the upper casing 11 by sintering, and the lower part 44 is connected to the top surface of the lower casing 21 by sintering. In this embodiment, the wick material 41 is a copper mesh or is formed by sintering of copper powder. As shown in FIG. 1, when copper mesh is used as the wick material 41, it is preferred that the copper mesh is band-shaped and has a predetermined width so as to wrap around the support member 31 and overlap a predetermined length. As such, the wick material 41 can surround the support member 31 completely.

The working fluid is injected into the receiving space 12 and absorbed by the wick material 41. The working fluid is not shown in the drawings because it is difficult to be represented and it is conventional.

The wick material 41 is stopped against the bottom surface of the upper casing 11 and the top surface of the lower casing 21 by support of the upper abutting ends 321 and the lower abutting ends 322 of the plurality of ribs 32 of the support member 31. In addition, by means of the interconnection of the upper abutting ends 321 and the lower abutting ends 322 of the ribs 32, the ribs 32 are inclined and each has a relatively higher end and a relatively lower end, so that a plurality of subspaces 33 are respectively formed under a body of each rib 32 close to the upper abutting end 321 and above the body of each rib 32 close to the lower abutting end 322. The subspaces 33 are in communication with the surrounded spaces 34 between the ribs.

The above-mentioned description reveals the structure of this embodiment, and this embodiment in use will be further described below.

Figure 6:
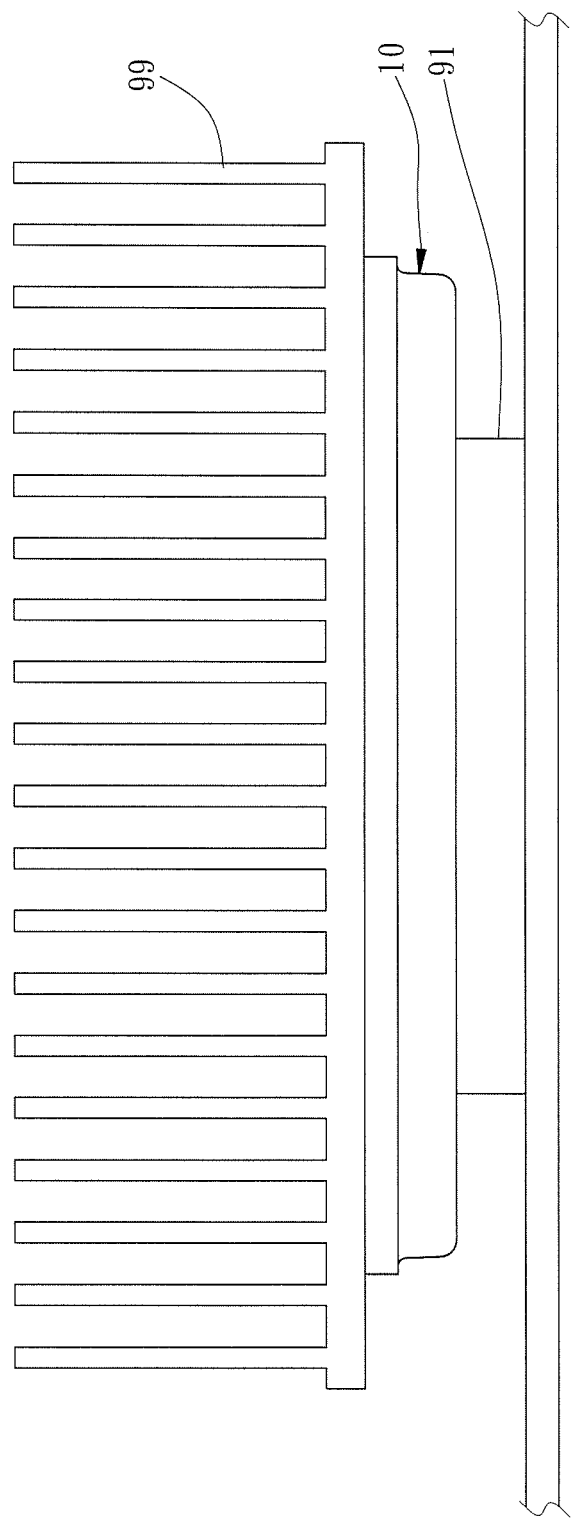
FIG. 6 is a schematic view of the first preferred embodiment of the present disclosure, showing the vapor chamber is in use.

Please refer to FIG. 6, the vapor chamber 10 of the present disclosure is assembled, before being used, with a heat-generating source 91 (such as a computer chip) and a heat sink 99 in a manner that the heat-generating source 91 is attached to the lower casing 21 and the heat sink 99 is attached to the upper casing 11.

Figure 3:
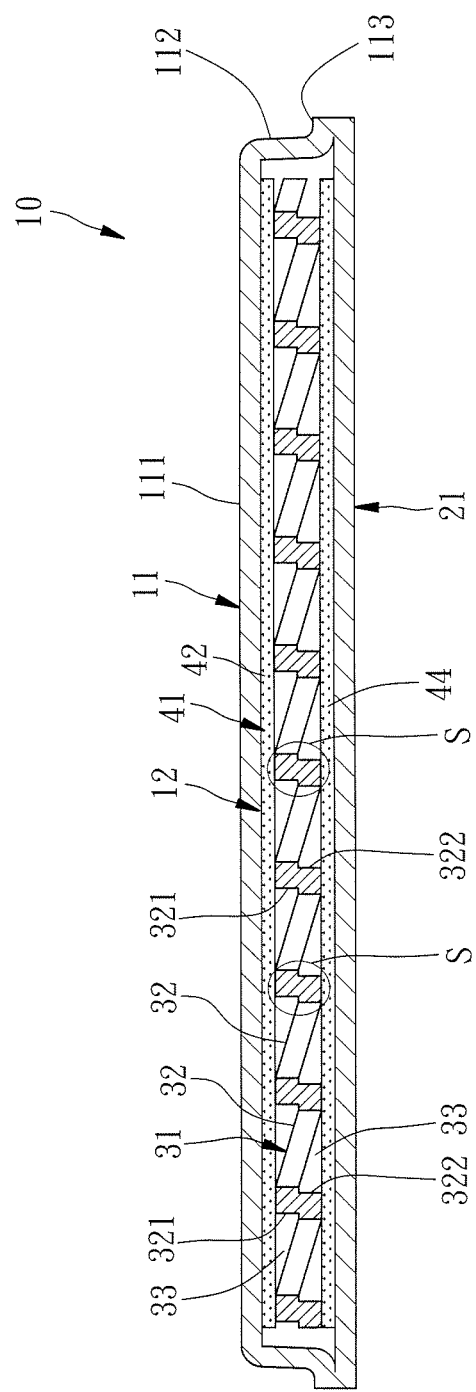
FIG. 3 is a schematic sectional view of the first preferred embodiment of the present disclosure.
Figure 5:
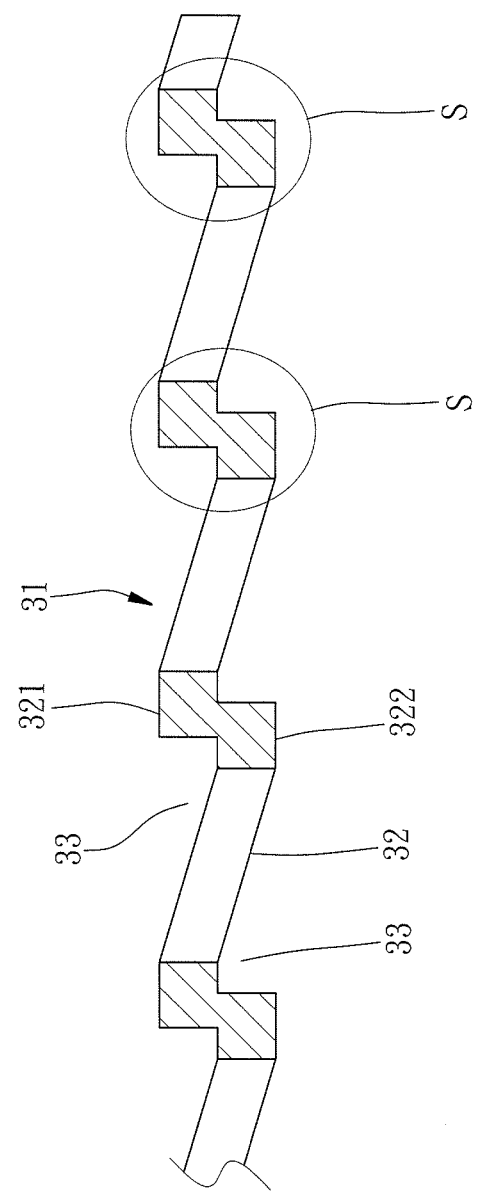
FIG. 5 is a schematic sectional view taken along line 5-5 of the FIG. 4.

As shown in the FIG. 3 through FIG. 5, because the wick material 41 is stopped against the bottom surface of the upper casing 11 and the top surface of the lower casing 21 by support of the upper abutting ends 321 and the lower abutting ends 322 of the support members 31 of this embodiment, each upper abutting end 321 and the lower abutting end 322 located thereunder form a support body S being contacted against the wick material 41 by its top and bottom sides. The support body S is strong enough to prevent deformation under an external force and thus can provide sufficient support strength to the vapor chamber 10 of the present disclosure. Therefore, the vapor chamber can be prevented from being deformed by a normal external force such as clamping force applied to the vapor chamber 10 by a common clamp or a buckling device for fixing the heat sink in the art. As a result, the temperature uniformity and thermal conduction of the vapor chamber 10 of the present disclosure can be maintained during normal operation.

In addition, during operation of the vapor chamber 10, because the subspaces 33 are in communication with the surrounded spaces 34, the vapor produced by the heating of the working fluid can flow freely in the receiving space 12, so that the temperature uniformity and thermal conduction of the vapor chamber 10 of the present disclosure can be further enhanced.

Other working principles of the vapor chamber of the present disclosure, such as the thermal conduction or heat dissipation effect caused by evaporation and condensation of the working fluid, are the same as that of the prior arts, thus related descriptions are omitted here.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A vapor chamber, comprising: an upper casing;
a lower casing connected to the upper casing in a manner that the upper casing and the lower casing are connected together edge-to-edge to form a receiving space;
a support member disposed in the receiving space and formed by a plurality of ribs connected with each other, a plurality of surrounded spaces being formed and regularly arranged between the plurality of ribs, wherein two ends of each rib are respectively defined as an upper abutting end and a lower abutting end, the upper abutting ends of two ribs, which are integrally formed together, are is located on the lower abutting ends of two other ribs, and the lower abutting ends of two ribs, which are integrally formed together, are located under and connected to the upper abutting ends of two other ribs;
a wick material disposed in the receiving space, the wick material being band-shaped, being arranged annularly around a top, a bottom, and both sides of the support member, and has an upper part corresponding to the top of the support member and a lower part corresponding to the bottom of the support member, wherein the upper part of the wick material is connected to a bottom surface of the upper casing by sintering, and the lower part of the wick material is connected to a top surface of the lower casing by sintering; and
a working fluid injected into the receiving space and absorbed by the wick material; wherein the wick material is stopped against the bottom surface of the upper casing and the top surface of the lower casing by support of the upper abutting ends and the lower abutting ends of the plurality of ribs of the support member, the plurality of ribs are inclined and each has a relatively higher end and a relatively lower end by means of the interconnection of the upper abutting ends and the lower abutting ends of the plurality of ribs, and a plurality of subspaces that are in communication with the surrounded spaces between the ribs are respectively formed under a body of each rib close to the upper abutting end and above the body of each rib close to the lower abutting end, wherein the plurality of ribs are formed integrally, and wherein each two of the ribs, which have the upper abutting ends integrally formed together, extend backwardly and downwardly from the upper abutting ends toward a rear wall of the vapor chamber and two opposing sidewall of the vapor chamber, and the lower abutting ends of another two of the ribs are located under the upper abutting ends are partially overlapped in a way that a support column is integrally formed and abutted between the upper part and the lower part of the wick mat.

2. The vapor chamber according to claim 1, wherein two lower abutting ends of two ribs located under the upper abutting end of one rib are connected with each other, and two upper abutting ends of two ribs located on the lower abutting end of one rib are connected with each other.

3. The vapor chamber according to claim 1, wherein the lower casing has a plate-shape, and the upper casing has a plate body, a side wall extending downwardly from an edge of the plate body and a shoulder part extending horizontally outwardly from the side wall; the upper casing is attached to the top surface of the lower casing through the shoulder part, and the shoulder part and the top surface of the lower casing are bonded together by a welding process to form a structure having no weld joint.

4. The vapor chamber according to claim 1, wherein an edge of the upper casing and an edge of the lower casing are bonded together by a welding process to form a structure having no weld joint.

5. The vapor chamber according to claim 3, wherein the welding process is a high-energy welding including at least one of electron-beam welding, high-frequency arc welding, and laser-beam welding.

6. The vapor chamber according to claim 4, wherein the welding process is a high-energy welding including at least one of electron-beam welding, high-frequency arc welding, and laser-beam welding.

7. The vapor chamber according to claim 1, wherein the wick material is a copper mesh or is formed by sintering of copper powder.

8. The vapor chamber according to claim 1, wherein each surrounded space of the support member is substantially formed and surrounded by four of the ribs.

* * * * *